(12) United States Patent
Akatsuka et al.

(10) Patent No.: US 6,261,481 B1
(45) Date of Patent: Jul. 17, 2001

(54) INSULATING COMPOSITION

(75) Inventors: Masaki Akatsuka, Hitachi; Yoshitaka Takezawa, Hitachinaka; Yuzo Ito, Mito, all of (JP)

(73) Assignee: Hitachi, LTD, Tokyo (JP)

( * ) Notice: Subject to any disclaimer, the term of this patent is extended or adjusted under 35 U.S.C. 154(b) by 0 days.

(21) Appl. No.: 09/267,670

(22) Filed: Mar. 15, 1999

(30) Foreign Application Priority Data

Mar. 19, 1998 (JP) .................................................. 10-069778

(51) Int. Cl.$^7$ .............................. H01B 3/18; H01B 3/40; C09K 19/38; C08L 101/12
(52) U.S. Cl. .................... 252/567; 252/299.01; 252/570; 257/701; 257/705; 174/120
(58) Field of Search ............................. 252/299.01, 567, 252/570; 257/701, 705; 174/120

(56) References Cited

U.S. PATENT DOCUMENTS

| 4,837,407 | * | 6/1989 | Nezu ................................. 174/68.5 |
| 5,811,504 | | 9/1998 | Shiota et al. .......................... 528/27 |

FOREIGN PATENT DOCUMENTS

| 206254 | * | 6/1986 | (EP) . |
| 61-291649 | * | 12/1986 | (JP) . |
| 61-296068 | * | 12/1986 | (JP) . |
| 62-100577 | * | 5/1987 | (JP) . |
| 63-264828 | * | 11/1988 | (JP) . |
| 1-149303 | * | 6/1989 | (JP) . |
| 2-28352 | * | 1/1990 | (JP) . |
| 2-5307 | * | 1/1990 | (JP) . |
| 2-127438 | * | 6/1990 | (JP) . |
| 9-118673 | | 5/1997 | (JP) . |

OTHER PUBLICATIONS

Caplus 1994: 713843*
Caplus 1996: 271269*
Caplus 1995: 383136*
"In Situ Photopolymerized, Oriented Liquid Crystalline Diacrylates with High Thermal Conductivities", Advance Materials 1993, 5. No. 2 pp. 107–109.*
"Synthesis and Curing of Novel LC Twin Expoxy Monmers for Liquid Crystal Thermosets", J. of Polymer Sci.: Part A: Polymer Chemistry, vol. 34, pp. 1291–1301 (1996).*
"Effect of the Network Structure on Thermal and Mechanicl Properties of Mesogenic Epoxy Resin cCured with Aromatic Amine", J. of Polymer Sci.: Part B: Polymer Physics, vol. 35, pp. 397–405 (1997).*

* cited by examiner

Primary Examiner—Shean C. Wu
(74) Attorney, Agent, or Firm—Antonelli, Terry, Stout & Kraus, LLP

(57) ABSTRACT

An insulating material of high electrically insulating properties and high thermal conductivity is provided wherein the high thermal conductivity is attained by having a liquid crystal resin comprising a polymerization product of a resin composition containing a monomer which has a mesogen group.

16 Claims, 2 Drawing Sheets

INSULATING COMPOSITION

BACKGROUND OF THE INVENTION

The present invention relates to an organic insulating composition, which is electrically insulative in nature and has an excellent thermal conductivity.

DESCRIPTION OF THE PRIOR ART

Almost all electrical appliances, from motors and generators to printed circuit boards and IC chips, are constituted of conductors, through which an electric current is passed, and insulating materials. In recent years, miniaturization of these electrical appliances has undergone rapid progress, for which the requirements of characteristic properties for insulating materials become very severe. Especially, the quantity of heat generated from conductors, which are packed with a high density owing to such miniaturization, increases, with the attendant problem as to how to dissipate the heat.

Conventionally, organic insulating compositions have been in wide use as an insulating material for various types of electrical appliances because of their high insulating performance and the ease in molding. However, organic insulating compositions are usually low in thermal conductivity, which is one of the factors impeding such dissipation of heat, as mentioned above. Accordingly, the need for organic insulating compositions having a high thermal conductivity is a very high.

For achieving high thermal conductivity, there is known method of utilizing conductive materials to an extent not impeding insulating properties. For instance, in Japanese Laid-open Patent Application No. Sho 61-2716, there are described thermoplastic plastics, wherein powders of light metals, such as aluminum, or powders of non-ferrous metals are filled in resins, ensuring good thermal conductivity and electrical insulation. Japanese Laid-open Patent Application No. Sho 63-175493 sets out a printed circuit board that makes use, as an insulating material, of electron conjugated aromatic polymers such as polythiophene. This approach utilizes the nature of electron conjugated aromatic polymers: such polymers serve as a conductor when used in combination with dopants; and, they serve as an insulator when no dopant is used. However, these methods make essential use of conductive substances, so that the dielectric breakdown voltage of the organic insulating compositions becomes very low.

Another method of achieving high thermal conductivity involves the use of inorganic ceramics of high thermal conductivity which are filled in organic insulating compositions. Examples of inorganic ceramics known in the art include silicon dioxide, aluminum oxide, magnesium oxide, beryllium oxide, boron nitride, aluminum nitride, silicon nitride, silicon carbide, aluminum fluoride, calcium fluoride and the like. When inorganic ceramics having both electrical insulating properties and high thermal conductivity are used, the dielectric breakdown voltage is improved, while achieving a high thermal conductivity. However, when inorganic ceramics are mixed with a monomer of the organic insulating composition, the resultant mixture has a much increased viscosity. Thus, the working properties become very poor, and it is difficult to make a fine structure. Moreover, it is known that organic insulating compositions filled with inorganic ceramics are lower in strength. In addition, composite organic insulating compositions, wherein two or more materials are mixed as set out above, are liable to cause separation at the interfaces between the two or more materials, with the possibility that, when these compositions are used over a long time, an abrupt lowering, such as of the dielectric breakdown voltage, may occur.

In Japanese Laid-open Patent Application No. Sho 61-296068, there is described a plastic compound of high thermal conductivity, in which polymer fibers oriented to a super-high degree are used. This makes use of the nature of polymer fibers, as set forth in POLYMER Vol. 19, P. 155 (1978), that super-highly oriented polymer fibers have a thermal conductivity which is improved along the fiber axis. However, the super-highly oriented polymer fibers are lower in thermal conductivity in directions orthogonal to the fiber axis. If the polymer fibers are randomly dispersed in an organic insulating composition, the thermal conductivity is not improved to a significant extent. When polymer fibers are allowed to align in one direction in an organic insulating composition, the resultant organic insulating composition exhibits excellent thermal conductivity along the direction of alignment of the fibers, but its thermal conductivity in the other directions is conversely lower. Further, the composition in this case consists of a composite insulating composition, which contains a mixture of two materials. As set out hereinabove, such a composition is liable to cause separation at the interface between materials.

For achieving high thermal conductivity of a single organic insulating composition, a method is known which utilizes the fact that the thermal conductivity along the direction of an oriented molecular chain becomes high. In Japanese Laid-open Patent Application Nos. Hei 1-149303, Hei 2-5307, Hei 2-28352, and Hei 2-127438, there are described methods of preparing organic insulating compositions comprising polyoxymethylene or polyimides in a state wherein an electrostatic voltage is applied thereto. In Japanese Laid-open Patent Application No. Sho 63-264828, sheets, of the type in which molecular chains of polypropylene, polyethylene or the like are aligned, are laminated so that the directions of the alignment are superposed and bonded together to obtain a laminate. Thereafter, the laminate is cut into thin pieces along a direction parallel to the direction of the alignment to obtain an organic insulating composition wherein the molecular chains are aligned in the longitudinal direction of the thin pieces. In these methods, the molecular chains are aligned in a given direction in order to make use of increase in conductivity along the molecular chains. However, such organic insulating compositions exhibit lower thermal conductivity in the other directions.

In ADVANCED MATERIALS, Vol. 5, p. 107 (1993) and German Laid-open Patent Application No. 4226994, there are described materials obtained by orienting a monomer, such as a diacrylate having a mesogen group, in one direction and subjecting it to a crosslinking reaction. In these materials, molecular chains are likewise aligned in one direction so as to utilize the thermal conductivity that becomes higher along the direction of the molecular chains. Accordingly, the resultant organic insulating compositions become lower in thermal conductivity in the other directions.

As a method which makes use of a single organic insulating composition and with which high thermal conductivity in all spatial directions can be achieved, it may occur to one to use an organic insulating composition which has be converted into a single crystal. However, it is actually very difficult to convert an organic insulating composition into a single crystal.

SUMMARY OF THE INVENTION

It is accordingly an object of the invention to provide an organic insulating composition, which has good electric insulating properties and excellent thermal conductivity.

We have made it clear that low thermal conductivity ordinarily experienced in organic insulating compositions is ascribed to defects present in the organic insulating compositions. It has been found that when an organic insulating composition has a liquid crystal resin comprising a polymerization product of a resin composition containing a monomer which has a mesogen group, defects in the organic insulating composition are reduced in number, thereby providing an organic insulating composition having a thermal conductivity of 0.4 W/mK or over. In addition, the organic insulating composition has thermal conductivities in two or more directions including directions substantially vertical to each other, which are, respectively, 0.4 W/mK or over.

DETAILED DESCRIPTION OF THE PREFERRED EMBODIMENTS

Figure 1A:
FIGS. 1A to 1C are, respectively, diagrams illustrating molecules of a monomer having a mesogen group but which are not arranged, a liquid polymer of a monomer having a mesogen group partially arranged in order, and a solid polymer of a monomer having a mesogen group partially arranged in order respectively.

Features and embodiments of the invention are described below.

(1) An insulating composition according to the invention is characterized in that it has a liquid crystal resin comprising a polymerization product of a resin composition containing a monomer which has a mesogen group, having the thermal conductivity of the composition, in directions mutually orthogonal to each other, respectively, at 0.4 W/mK or over.

The monomer contained in the resin composition should preferably have an epoxy group.

Moreover, the monomer preferably has a mesogen group of the following formula (1) in the molecule.

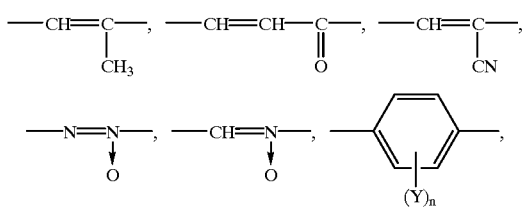

wherein X represents single bond, —N=N—, —C≡C—, —CH=N—, —CH=CH—,

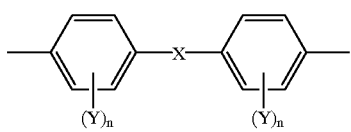

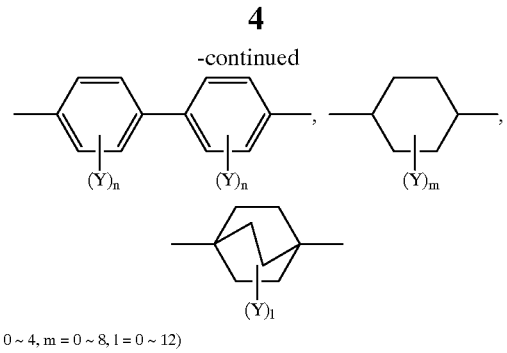

$(n = 0 \sim 4, m = 0 \sim 8, l = 0 \sim 12)$ or a combination of two or more groups indicated above, and Y represents —R, —OR (in which R is an aliphatic hydrocarbon having 1 to 8 carbon atoms), —F, —Cl, —Br, —I, —CN, —NO$_2$,

(1)

The polymerization of the resin composition containing a monomer may be carried out, if necessary, (A) in an electric field, (B) in a magnetic field, (C) while irradiating an electromagnetic wave, or through a combination of (A) to (C).

After polymerization, the resin composition may be stretched, rolled, or rubbed. When the polymerization is carried out under such conditions as mentioned above or when the resultant composition is treated after the polymerization, it becomes possible to preferentially turn molecular chains of a monomer in a certain direction, thereby achieving better thermal conductivity along that direction. In addition, because the liquid crystal resin is contained, the thermal conductivities in the other directions are also good.

It will be noted that for stretching, a longitudinal stretching machine having two or more rolls whose rotation speeds differ from each other can be used. When a sheet-shaped resin composition is drawn first to a lower-speed roll of a longitudinal stretching machine and then to a higher-speed roll, a sheet can be stretched at a draw ratio between the speeds. The molecular chains are likely to be oriented in the stretched direction.

On the other hand, the rolling may be performed, for example, by use of a calender having two or more rolls. The resin composition in the form of powder, lumps or a sheet is sandwiched between the rolls of the calender and thermally compressed, thereby obtaining a sheet rolled between the rolls. The molecular chains are likely to be oriented in the rolled direction.

The resin composition may further comprise inorganic ceramics.

The inorganic ceramics, which may be present in the resin composition, should preferably have a thermal conductivity of 1 W/mK or over. Specific examples include those selected from silicon dioxide, aluminum oxide, magnesium oxide, beryllium oxide, boron nitride, aluminum nitride, silicon nitride, silicon carbide, aluminum fluoride and calcium fluoride. These may be used singly or in combination of two or more.

Especially, the inorganic ceramics, which can be contained in the organic insulating composition of the invention, should preferably be those ceramics having a thermal conductivity of 1 W/mK or over and include, for example, silicon dioxide, aluminum oxide, magnesium oxide, beryllium oxide, boron nitride, aluminum nitride, silicon nitride, silicon carbide, aluminum fluoride and calcium fluoride. More preferably, those inorganic ceramics having a thermal conductivity of 10 W/mK or over are used, including, for example, aluminum oxide, magnesium oxide, boron nitride, aluminum nitride, silicon nitride, silicon carbide and aluminum fluoride. Of these, aluminum oxide having a volume resistance of $10^{16}$ Ωcm or over is most preferred.

It is preferred that a resin composition is heated under conditions that a monomer having a mesogen group is partially arranged in order when the polymerization starts.

The liquid crystal resin of the invention is obtained by polymerizing a resin composition containing a monomer which has a mesogen group under conditions that the monomer is partially arranged in order at least during polymerization, and that it is freezed, remaining partially arranged in order. The liquid crystal resin is confirmed by a polarizing optical microscope or x-ray diffraction.

The organic insulating composition of the invention is obtainable by polymerizing a monomer having a mesogen group. Polymers and resins, which can be ordinarily utilized for insulating purposes, are preferred, including polyamides, polyesters, polycarbonates, polysulfones, polyimides, polybenzimidazoles, polyurethanes, epoxy resins, acrylic resins, methacrylic resins, unsaturated polyester resins, and the like. Of these, thermosetting resins having high strength are preferred, including polyurethane resins, epoxy resins, acrylic resins, methacrylic resins, and unsaturated polyester resins. In view of the ease in molding and the high insulation, epoxy resins are more preferred.

The mesogen group used herein means a functional group capable of developing liquid crystallinity. Specific examples include those of the formula (3) indicated below.

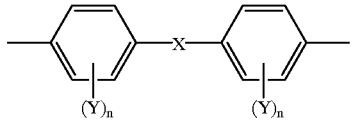

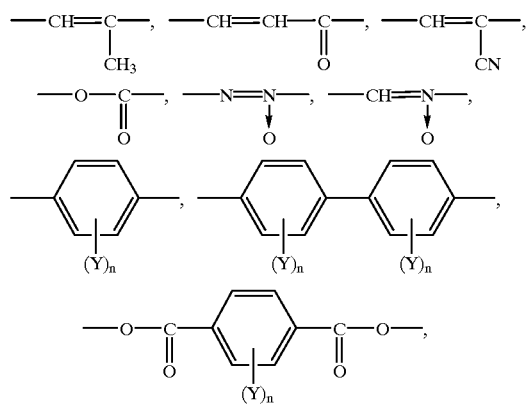

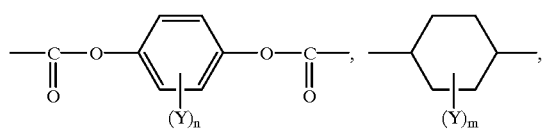

wherein X represents single bond, —N=N—, —C≡C—, —CH=N—, —CH=CH—,

(n = 0 ~ 4, m = 0 ~ 8, l = 0 ~ 12)

or a combination of two or more groups indicated above, and Y represents —R, —OR (in which R is an aliphatic hydrocarbon having 1 to 8 carbon atoms), —F, —Cl, —Br, —I, —CN, —NO$_2$,

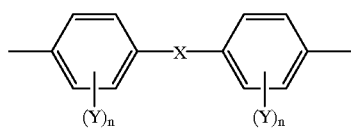

(3)

Preferably, mention is made of groups of the following formula (1), which are unlikely to undergo hydrolysis.

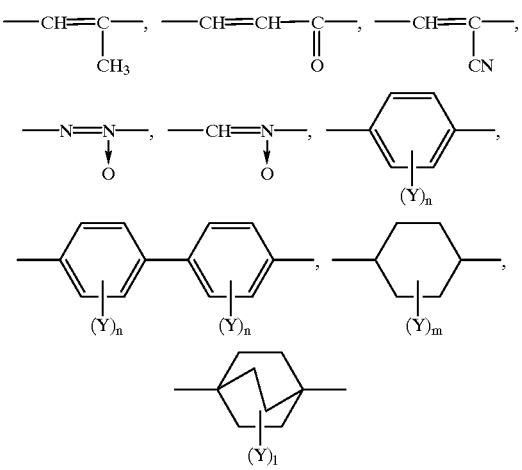

wherein X represents single bond, —N=N—, —C≡C—, —CH=N—, —CH=CH—,

(n = 0 ~ 4, m = 0 ~ 8, l = 0 ~ 12)

or a combination of two or more groups indicated above, and Y represents —R, —OR (in which R is an aliphatic hydrocarbon having 1 to 8 carbon atoms), —F, —Cl, —Br, —I, —CN, —NO$_2$, (1)

The polymers of monomers having a mesogen group such as indicated above are resistant to water and are reliable over a long time, so that the composition comprising the polymer can be used for outdoor purposes, and thus, have utility over a wide range of fields.

In the organic insulating composition of the invention, a resin composition containing a monomer which has a mesogen group may not be arranged in order when the polymerization starts, but must be partially arranged in order during polymerization. It is preferred to use a preparation process wherein a resin composition is heated under conditions that a monomer having a mesogen group is partially arranged in order when the polymerization starts.

Because an organic insulating composition of the invention has a liquid crystal resin comprising a polymerization product of a resin composition containing a monomer which has a mesogen group, the composition exhibits excellent thermal conductivity in two directions substantially orthogonal to each other. This leads to improved dissipating properties of heat generated from conductors of electrical appliances. Electrical appliances, which make use of the organic insulating composition of the invention, thus have improved heat dissipating properties and can be down-sized.

It has been made clear that a material, which is obtained by orienting a monomer of the afore-indicated formula (3) having the mesogen group in a given direction and is subsequently subjected to crosslinking reaction, is not resistant to water and has a poor long-term reliability; and this is caused by the hydrolysis of a carboxyl group contained in the mesogen group. It has been found that when using a monomer having a carboxyl group-free mesogen group in the molecule, good long-term reliability is ensured.

According to another embodiment of the invention, there is provided an organic insulating composition which comprises a polymerized product obtained by polymerizing a resin composition containing a monomer having a mesogen group of the afore-indicated chemical formula (1), and which exhibits a liquid crystallinity or a liquid crystal state, wherein the composition has a thermal conductivity of 0.4 W/mK or over.

This organic insulating composition is conveniently usable as all or part of the insulating materials for electrical appliances, which include both conductors for passing an electric current and insulating materials. The conductors used in electrical appliances generate heat since an electric current passes therethrough. The insulating composition of the invention is particularly suitable for use in such heat-generating articles. Accordingly, a thermosetting resin composition capable of polymerization by application of heat that is hard to deform is essential in this case. It will be noted that the monomer used in the case should preferably have an epoxy group. In this embodiment, the organic insulating composition may be further treated under such polymerization conditions as set out hereinbefore or may be subjected to treatment after the polymerization in the afore-stated manner. In addition, such inorganic ceramics as indicated before may be incorporated in the composition. In such case, the electrically insulating composition may consist of ones which have been described hereinbefore as an organic insulating composition.

The mesogen group used in this embodiment is a functional group which is free of any carboxyl group and is able to develop liquid crystallinity. Specific examples include those indicated in the afore-indicated chemical formula (1). Because of the absence of a carboxyl group, hydrolysis is unlikely to occur, thus ensuring excellent long-term reliability.

Such an insulating composition has a liquid crystal resin comprising a polymerization product of a resin composition containing a monomer which has a mesogen group without a carboxyl group, thus exhibiting excellent thermal conductivity. The composition not only can improve the heat dissipating properties of conductors of electric appliances, but also has a good long-term reliability owing to the absence of a carboxyl group. When using the electrically insulating composition of the invention, electric appliances have improved heat dissipating properties and are able to be down-sized, ensuring their use in severe environments.

According to a further embodiment of the invention, there is provided an insulating composition having a liquid crystal resin comprising a polymerization product of a resin composition containing a monomer which has at least one reactive group selected from the group consisting of reactive groups of the following formula (2) and a mesogen group. Preferably, the composition should have a thermal conductivity of 0.4 W/mK or over.

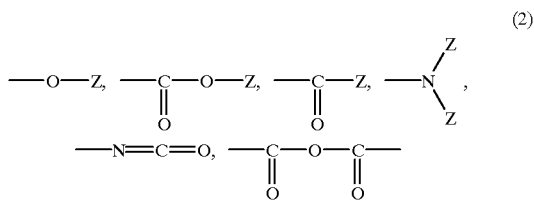

(2)

wherein Z represents hydrogen, an aliphatic hydrocarbon having 1 to 4 carbon atoms or a halogen.

The monomer used in this embodiment should preferably have a mesogen group of the chemical formula (1) in the molecule. Moreover, the composition may be polymerized under such conditions as set out hereinbefore, or may be further treated after polymerization. In addition, such inorganic ceramics as indicated before may be added to the composition.

The organic insulating composition may comprise those polymers or resins indicated before. Preferably, mention is made of polyamides, polyesters, polycarbonates, polysulfones, polyimides, polybenzimidazoles, polyurethanes, epoxy resins, acrilic resins, methacrylic resins, unsaturated polyester resins, and the like. In view of the ease in molding and the excellent insulating properties, epoxy resins are most preferred.

The reactive groups of the monomer used in the present invention include preferably those groups of the formula (2).

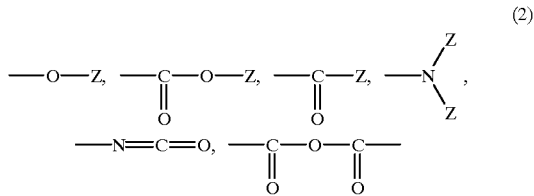

(2)

wherein Z represents hydrogen, an aliphatic hydrocarbon having 1 to 4 carbon atoms or a halogen.

The mesogen group used herein is preferably a functional group capable of developing liquid crystallinity and includes ones indicated in the afore-indicated formula (3). More preferably, the group indicated in the afore-indicated formula (1) is mentioned since such a group is unlikely to undergo hydrolysis.

The theory as to why the composition of the invention can achieve high thermal conductivity is explained as follows. Thermal conduction of material is broadly divided into electronic conduction and phonon conduction. The thermal conduction of an insulator is based mainly on phonons, and the thermal conductivity of the insulator lowers owing to the static scattering of phonons in defects in the material and also to the umklapp process, which is caused by mutual collision of phonons based on molecular vibrations or the anharmonicity of lattice vibrations. Ordinary organic insulating compositions (polymers) have a number of defects therein and exhibit great anharmonicity of molecular and lattice vibrations, thus generally having a small thermal conductivity.

For increasing the thermal conductivity of organic insulating compositions (polymers), the usual practice is to make use of electronic conduction, for which conductive polymers are frequently employed. As a matter of course, however, such a conductive polymer has a lower electric insulation and cannot be used as an insulating material.

Another approach is to utilize the nature of polymers wherein their thermal conductivity is greater along the direction of the main chain thereof. The main chains of a polymer are combined via a strong conjugated bond, so that the anharmonicity of vibrations (phonons) along the main chains is small. In addition, defects, which cause the static scattering of phonons, are much smaller than those present in a direction between vibrations occurring along the main chains (i.e. a direction vertical to the main chains). More particularly, the umklapp and static scattering processes of phonons are both smaller along the main chains than along the intramolecular direction, and so the thermal conductivity along the main chains becomes greater. In this approach, main chains are oriented in a desired direction, making use of a thermal conductivity increasing along the direction of the orientation. For the orientation of main chains, there may be used a stretching method, a method using an electric field, and a rubbing method.

In the prior art methods, although thermal conductivity along the direction of orientation increases, thermal conductivity along the direction orthogonal to the first-mentioned direction rather decreases. On use as an insulting material, it is predominantly intended that thermal conductivity is increased along a thickness of a polymeric insulator film. When using the prior art techniques wherein a polymer is oriented along the main chains thereof, it is very difficult to increase the thermal conductivity along the thickness of a polymeric insulator film.

In the practice of the invention, attention has been paid to the fact that, if the property of the order of a substance increases, thermal conductivity can be increased along a direction orthogonal to the molecular chains. More particularly, the increase of the order property results in the decrease in anharmonicity of vibrations and also in the reduction in the number of defects which cause static scattering of phonons. In order to increase the property of order of a substance to a maximum, perfect crystals should be utilized (for one instance, a diamond exhibits a very high thermal conductivity). However, it is substantially impossible to apply perfect crystals of polymer insulators as an insulating material. In the present invention, attention has been drawn to a liquid crystal state of a substance, which has a high degree of order next to crystals. More particularly, an organic insulating composition obtained by polymerizing a monomer having liquid crystallinity has a reduced number of defects not only in the direction of molecular chains, but also in a direction orthogonal to the molecular chains due to the presence of the liquid crystal state. Moreover, such a composition exhibits small anharmonicity of vibrations. Accordingly, the composition has greater thermal conductivity irrespective of a specific direction of orientation in comparison with conventional organic polymer insulating materials.

As the most preferable mesogen group, which is a functional group capable of developing liquid crystallinity, there is mentioned a group of the following formula (4) because of the ease in synthesis. From the standpoint that degradation caused by hydrolysis is unlikely to occur, the groups of the afore-indicated formula (1) are preferably used. It should be noted that the groups of the afore-indicated formula (3) can be used without limitation to achieve the purposes of the invention in view of the fact that they are a functional group capable of developing liquid crystallinity.

The term "liquid crystallinity" is intended to mean a property of liquid present in a given temperature range in the intermediate state between crystals and a liquid.

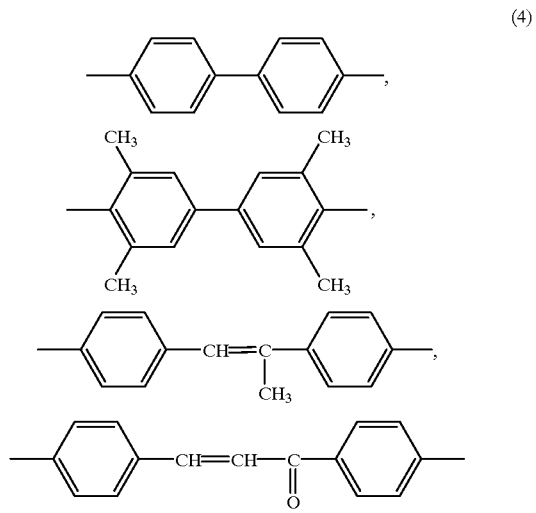

(4)

The invention is more particularly described by way of examples.

EXAMPLE 1

An epoxy resin composition obtained by mixing 270 g of 4,4'-biphenyl diglycidyl ether and 200 g of 4,4'-diaminophenylbenzoate was cast into a mold, and cured at 150° C. for 10 hours, followed by further thermal curing at 200° C. for 5 hours to obtain an epoxy resin sheet with a thickness of 1 mm.

The epoxy resin sheet was subjected to a measurement of thermal conductivity along its thickness direction and in an in-plane direction. The thermal conductivity was calculated from the thermal diffusivity and specific heat capacity along the thickness direction and in the in-plane direction, which were, respectively, determined according to a laser flush method, and also from the density of a sample. The measurement was made at room temperature. The thermal conductivities along the thickness direction and in the in-plane direction were, respectively, 0.43 to 0.44 W/mK, indicating excellent thermal conductivities.

The thermal conductivity can be calculated according to the following equation.

Thermal conductivity=(thermal diffusivity)×(volumetric specific heat capacity)×(density)

The thermal diffusivity can be measured both in an in-plane direction and along the thickness direction according to a laser flush method. Moreover, a value of (volumetric specific heat capacity)×(density) can also be measured according to the laser flush method.

The laser flush method is one wherein laser pulses are irradiated on a sample surface, and a heat constant is measured from a temperature hysteresis at an opposite surface of the sample. From a width of elevation to a maximum temperature at the opposite surface of the sample, a value of (volumetric specific heat capacity)×(density) is calculated, and the thermal diffusivity is determined from a time before the temperature of the opposite surface of the sample is elevated to ½ of the width of elevation to the maximum temperature. A detection point is at the opposite surface within a zone of the laser irradiation for the direction along the thickness direction and at the opposite surface outside the zone of the laser irradiation for the in-plane direction. The sample has a shape of 10ϕ×1 mm in the direction of the thickness and 3 mm square×1 mm in the in-plane direction.

Hydrolysis was evaluated as follows: the epoxy resin sheet was subjected to a tensile test prior to and after treatment with saturated steam at 121° C. for one day; and a lowering rate of the tensile strength was calculated. The tensile test was conducted at room temperature, and the tensile strength was obtained as an average value of three samples. With the above resin, the lowering rate was found to be 10%, indicating an excellent long-term reliability.

Figure 1B:
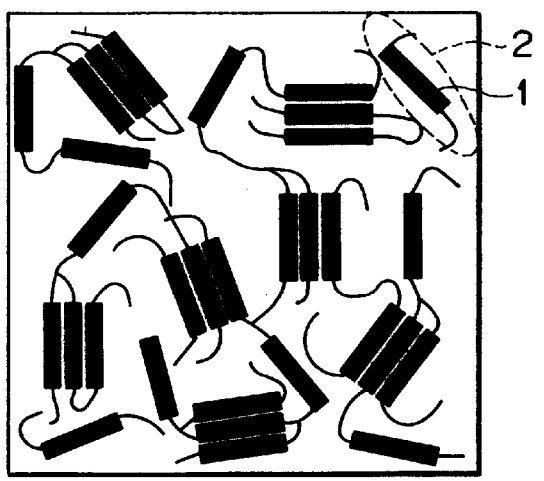
Figure 1C:
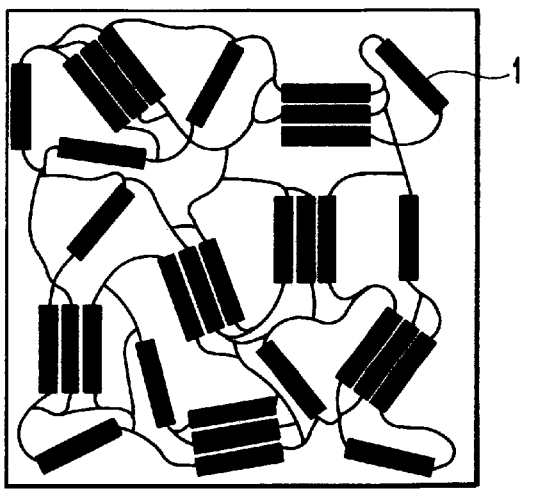

Reference is now made to FIGS. 1A to 1C for illustrating a change during polymerization of a monomer which has a mesogen group. In FIGS. 1A to 1C, there is a mesogen group 1, and is a monomer 2 having a mesogen group. As shown in FIG. 1A, the molecules of the monomer 2 have the mesogen group 1, but the molecules are not arranged in order when the polymerization starts at 150° C. As shown in FIG. 1B, the molecules are partially arranged in order during polymerization. After that, as shown in FIG. 1C, the molecules are freezed, remaining partially arranged in order. The molecules of the monomer 2 having the mesogen group 1 must be partially arranged in order at least during polymerization.

EXAMPLE 2

An epoxy resin composition obtained by mixing 270 g of 4,4'-biphenyl diglycidyl ether and 200 g of 4,4'-diaminophenylbenzoate was cast into a mold, and cured at 150° C. for 10 hours while applying a voltage of 1 kV along a thickness direction, followed by further thermal curing at 200° C. for 5 hours to obtain a 1 mm thick epoxy resin sheet.

In the same manner as in Example 1, the epoxy resin sheet was subjected to measurement of the thermal conductivity along its thickness direction and in the in-plane direction. The thermal conductivity along the in-plane direction was found to be at 0.43 W/mK, which was substantially the same value as in Example 1 wherein no voltage was applied. The thermal conductivity along the thickness direction was 2.2 W/mK. These values indicate excellent thermal conductivities.

The epoxy resin sheet was treated in saturated steam at 121° C. for one day in the same manner as in Example 1, revealing that the lowering rate of tensile strength was found to be 13%, indicating an excellent long-term reliability.

EXAMPLE 3

An epoxy resin composition obtained by mixing 370 g of 4,4'-bis(3,4-epoxybutene-1-yloxy)phenyl benzoate and 200 g of 4,4'-diaminodiphenylmethane was cast into a mold, and cured at 170° C. for 10 hours, followed by further thermal curing at 200° C. for 5 hours to obtain a 1 mm thick epoxy resin sheet.

In the same manner as in Example 1, the epoxy resin sheet was subjected to measurement of the thermal conductivity along its thickness direction and in the in-plane direction. The thermal conductivities along the thickness direction and in the in-plane direction were, respectively, 0.44 to 0.46 W/mK, indicating excellent thermal conductivities.

The epoxy resin sheet was treated in saturated steam at 121° C. for one day in the same manner as in Example 1, revealing that the lowering rate of tensile strength was found to be 45%.

Comparative Example 1

An epoxy resin sheet was made in the same manner as in Example 1 using bisphenol A-diglycidyl ether.

In the same manner as in Example 1, the epoxy resin sheet was subjected to measurement of the thermal conductivity along its thickness direction and in the in-plane direction. The thermal conductivities along the thickness direction and in the in-plane direction were, respectively, 0.18 to 0.20 W/mK, indicating excellent thermal conductivities.

In the same manner as in Example 1, the epoxy resin sheet was treated in saturated steam at 121° C. for one day, with the result that the lowering rate of tensile strength was at 11%.

EXAMPLE 4

100 g of 4,4'-diamino-α-methylstilbene and 120 g of pyromellitic dianhydride were reacted in 20 ml of N,N'-dimethylacetamide at room temperature for 5 hours to prepare polyamic acid. The polyamic acid solution was coated onto glass and dried at 120° C. for 2 hours, thereby obtaining an 80 μm thick polyamic acid film. The film was thermally treated at 300° C. for 1 hour to obtain a polyimide film.

The thermal conductivities in two directions within the plane of the polyimide film were measured. The thermal conductivities were calculated from the thermal diffusivities and specific heat capacities in two vertical in-plane directions, which were, respectively, determined according to an optical alternating current method, and also from the density of a sample. The measurement was conducted at room temperature. The thermal conductivity in either direction was found to be at 0.44 to 0.45 W/mK, indicating excellent thermal conductivities.

In the same manner as in Example 1, the polyimide film was treated in saturated steam at 121° C. for one day, from which the lowering rate of tensile strength was found to be 5%, indicating an excellent long-term reliability.

EXAMPLE 5

100 g of 4,4'-diaminophenyl benzoate and 120 g of pyromellitic acid dianhydride were used to obtain a polyimide film in the same manner as in Example 4.

In the same manner as in Example 4, the thermal conductivities in the two in-plane directions of the polyimide film were measured. The thermal conductivities in both directions were found to be 0.44 to 0.46 W/mK, indicating excellent thermal conductivities.

In the same manner Example 1, the polyimide film was treated in saturated steam at 121° C. for one day, from which the lowering rate of tensile strength was found to be 33%.

Comparative Example 2

100 g of 4,4'-diaminodiphenyl ether and 120 g of pyromellitic dianhydride were used to obtain a polyimide film in the same manner as in Example 4.

In the same manner as in Example 4, the thermal conductivities in the two in-plane directions of the polyimide film were measured. The thermal conductivities in both directions were found to be 0.15 to 0.17 W/mK.

In the same manner as in as in Example 1, the polyimide film was treated in saturated steam at 121° C. for one day, from which the lowering rate of tensile strength was found to be 5%.

As will be apparent from the foregoing, according to the invention, there can be obtained an organic insulating composition, which is electrically insulative and has excellent thermal conductivity in directions including two directions vertical to each other or more.

Moreover, the organic insulating composition not only is electrically insulative and has excellent thermal conductivity, but also ensures long-term reliability.

Applications of electrically insulating compositions are illustrated with reference of FIGS. 2 and 3.

Figure 2:
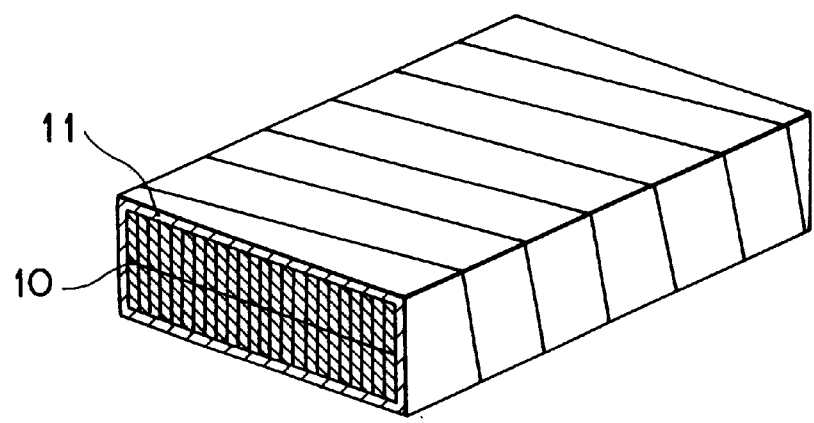
FIG. 2 is a schematic perspective view showing a generator coil using an electrically insulating composition according to the invention.

FIG. 2 shows a generator coil using an electrically insulating composition according to the invention. The generator coil includes a conductor 10 and an insulation-to-ground layer 11 as shown. The layer 11 is made of the composition of the invention, so that heat generated from the conductor 11 can be efficiently dissipated, thus leading to an increase in capacity.

Figure 3:
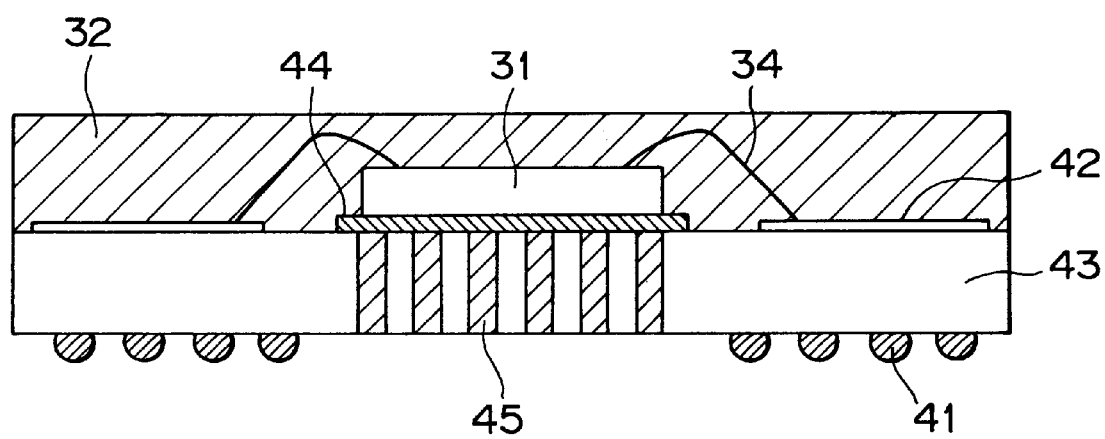
FIG. 3 is a schematic sectional view showing a semiconductor package using an electrically insulating composition according to the invention.

FIG. 3 shows a semiconductor package using an electrically insulating composition. The package includes a die pat 44 formed on one side of a printed circuit board 43 through which thermal vias 45 are formed. Solder bump electrodes 41 are formed on the other side of the board 43. An interconnecting pattern 42 is formed on the one side of the printed board 43 where the die pat 44 has been formed, and is connected to a bare chip 31, which is formed on the die pat 44, via Au wires 34. The interconnecting pattern 42, bare chip 31, Au wires 34 and die pat 44 are sealed with a sealant 32 as shown, thereby forming a semiconductor package. In this arrangement, when the electrically insulating composition of the invention is used to fill the thermal vias 45 of the semiconductor package, the package becomes light in weight and permits heat generated from the bare chip to effectively escape therethrough. In addition, the electrically insulating composition of the invention may be effectively usable as the sealant 32.

What is claimed is:

1. An insulating composition which has a liquid crystal region comprising a polymerization product of a resin composition containing a monomer which has a mesogen group, wherein molecules of the monomer are partially arranged in order at least during polymerization in forming the polymerization product, and said insulating composition has thermal conductivities along directions, which are substantially vertical to each other, at 0.4 W/mK or over, respectively.

2. An insulating composition according to claim 1, wherein said monomer has an epoxy group.

3. An insulating composition according to claim 1, wherein said monomer has a mesogen group of the following formula (1) in the molecule

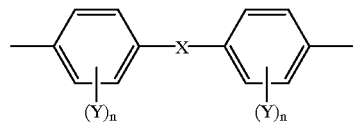

wherein X represents single bond, —N=N—, —C≡C—, —CH=N—, —CH=CH—,

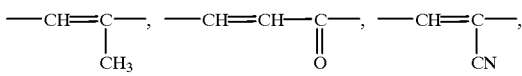

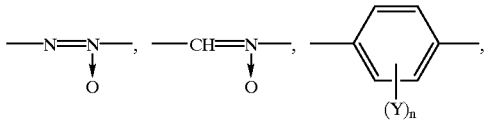

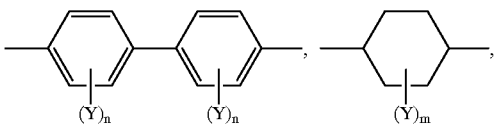

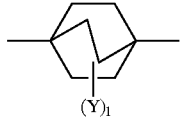

(n = 0 ~ 4, m = 0 ~ 8, l = 0 ~ 12)

or a combination of two or more groups indicated above, and Y represents —R, —OR (in which R is an aliphatic hydrocarbon having 1 to 8 carbon atoms), —F, —Cl, —Br, —I, —CN, —NO₂,

(1)

4. An insulating composition which is adapted for use in articles generating heat, said composition having a thermal conductivity of 0.4 W/mK or over, and having a thermally curing liquid crystal resin comprising a polymerization product of a resin composition containing a monomer which has a mesogen group capable of being thermally polymerized, wherein molecules of the monomer are partially arranged in order at least during polymerization in forming the polymerization product.

5. An insulating composition which is adapted for use in articles generating heat, said composition comprising a resin composition containing a monomer which has a mesogen group of the following formula (1) in the molecule and has a thermal conductivity of 0.4 W/mK or over

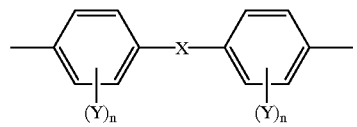

wherein X represents single bond, —N=N—, —C≡C—, —CH=N—, —CH=CH—,

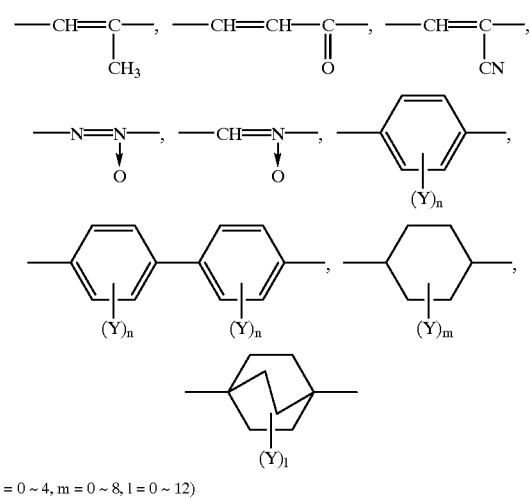

(n = 0 ~ 4, m = 0 ~ 8, l = 0 ~ 12)

or a combination of two or more groups indicated above, and Y represents —R, —OR (in which R is an aliphatic hydrocarbon having 1 to 8 carbon atoms), —F, —Cl, —Br, —I, —CN, —NO$_2$,

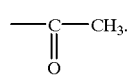 (1)

wherein molecules of the monomer are partially arranged in order at least during polymerization in forming a polymerization product of the resin composition.

6. An insulating composition which is adapted for use in articles generating heat, said composition having a liquid crystal resin comprising a polymerization product of a resin composition containing a monomer which has at least one reactive group selected from the group consisting of reactive groups of the following formula (2) and a mesogen group,

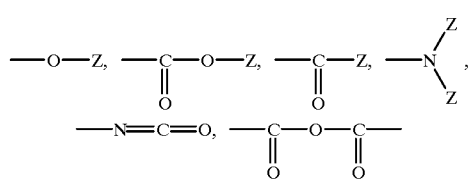 (2)

wherein Z represents hydrogen, an aliphatic hydrocarbon having 1 to 4 carbon atoms or a halogen, and wherein molecules of the monomer are partially arranged in order at least during polymerization in forming the polymerization product.

7. An insulating composition according to claim 4, having thermal conductivities along directions, which are substantially vertical to each other, at 0.4 W/mK or over.

8. An insulating composition according to claim 5, having thermal conductivities along directions, which are substantially vertical to each other, at 0.4 W/mK or over.

9. An insulating composition according to claim 6, having thermal conductivities along directions, which are substantially vertical to each other, at 0.4 W/mK or over.

10. An insulating composition according to claim 1, the polymerization having been carried out in at least one of (A) an electric field, (B) a magnetic field, and (C) while irradiating an electromagnetic wave.

11. An insulating composition according to claim 1, the composition having been stretched, rolled or rubbed after the polymerization.

12. An insulating composition according to claim 1, further comprising inorganic ceramic material.

13. An insulating composition according to claim 1, wherein the monomer is partially arranged in order when the polymerization starts.

14. An insulating composition according to claim 1, wherein the monomer has a carboxyl group-free mesogen group.

15. An insulating composition according to claim 4, wherein the monomer has a carboxyl group-free mesogen group.

16. An insulating composition according to claim 3, wherein said mesogen group is selected from the group consisting of

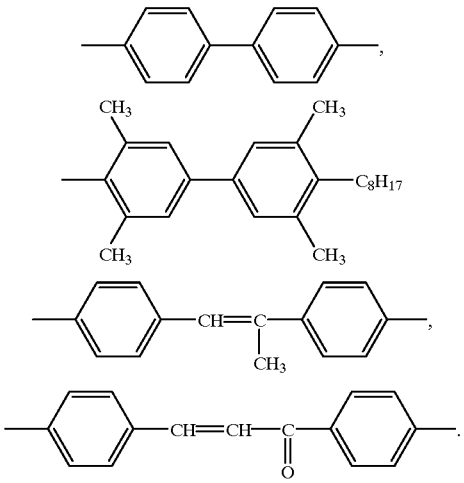 (4)

* * * * *